(12) United States Patent
Chinnusamy

(10) Patent No.: US 9,679,785 B2
(45) Date of Patent: Jun. 13, 2017

(54) SEMICONDUCTOR DEVICE AND METHOD OF ENCAPSULATING SEMICONDUCTOR DIE

(71) Applicant: Semtech Corporation, Camarillo, CA (US)

(72) Inventor: Satyamoorthi Chinnusamy, San Jose, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 14/810,254

(22) Filed: Jul. 27, 2015

(65) Prior Publication Data
US 2017/0032981 A1   Feb. 2, 2017

(51) Int. Cl.
*H01L 21/56* (2006.01)
*H01L 21/02* (2006.01)
(Continued)

(52) U.S. Cl.
CPC ...... *H01L 21/563* (2013.01); *H01L 21/02076* (2013.01); *H01L 21/30604* (2013.01);
(Continued)

(58) Field of Classification Search
CPC ......... H01L 21/76877; H01L 21/76895; H01L 23/36; H01L 21/52; H01L 24/24;
(Continued)

(56) References Cited

U.S. PATENT DOCUMENTS

| 6,338,980 B1 | 1/2002 | Satoh |
| 2011/0037144 A1* | 2/2011 | Chen .................. H01L 28/90 257/532 |

(Continued)

OTHER PUBLICATIONS

Strothman, Tom et al., (2014) "Encapsulant Wafer Level Package Technology," IEE 2014 Electronic Components and Technology Conference Proceedings, pp. 930-934, IEE 978-1-4799-2407-3.

(Continued)

*Primary Examiner* — Thomas L Dickey
*Assistant Examiner* — Changhyun Yi
(74) *Attorney, Agent, or Firm* — Robert D. Atkins; Patent Law Group: Atkins and Associates, P.C.

(57) ABSTRACT

A semiconductor device has a semiconductor wafer. The semiconductor wafer includes a plurality of semiconductor die. An insulating layer is formed over an active surface of the semiconductor die. A trench is formed in a non-active area of the semiconductor wafer between the semiconductor die. The trench extends partially through the semiconductor wafer. A carrier with adhesive layer is provided. The semiconductor die are disposed over the adhesive layer and carrier simultaneously as a single unit. A backgrinding operation is performed to remove a portion of the semiconductor wafer and expose the trench. The adhesive layer holds the semiconductor die in place during the backgrinding operation. An encapsulant is deposited over the semiconductor die and into the trench. The carrier and adhesive layer are removed. The encapsulated semiconductor die are cleaned and singulated into individual semiconductor devices. The electrical performance and functionality of the semiconductor devices are tested.

15 Claims, 7 Drawing Sheets

(51) Int. Cl.
*H01L 21/306* (2006.01)
*H01L 21/78* (2006.01)
*H01L 21/784* (2006.01)
*H01L 21/683* (2006.01)
*H01L 23/00* (2006.01)

(52) U.S. Cl.
CPC ........ *H01L 21/568* (2013.01); *H01L 21/6835* (2013.01); *H01L 21/6836* (2013.01); *H01L 21/78* (2013.01); *H01L 21/784* (2013.01); *H01L 24/96* (2013.01); *H01L 21/561* (2013.01); *H01L 2221/6834* (2013.01); *H01L 2221/68327* (2013.01); *H01L 2221/68381* (2013.01); *H01L 2224/94* (2013.01)

(58) Field of Classification Search
CPC ............. H01L 24/82; H01L 2924/3025; H01L 23/49816; H01L 23/5226; H01L 23/552; H01L 23/3675; H01L 23/528; H01L 23/5389; H01L 21/78
USPC ......... 438/122, 127, 613, 637; 257/659, 712
See application file for complete search history.

(56) References Cited

U.S. PATENT DOCUMENTS

| | | | |
|---|---|---|---|
| 2012/0187584 A1* | 7/2012 | Lin | H01L 23/3107 257/790 |
| 2013/0320519 A1* | 12/2013 | Kim | H01L 21/6836 257/734 |
| 2014/0175677 A1* | 6/2014 | Takamoto | H01L 21/6836 257/778 |
| 2014/0179084 A1* | 6/2014 | Lei | H01L 21/78 438/463 |
| 2014/0264817 A1* | 9/2014 | Lee | H01L 25/0657 257/712 |
| 2016/0042998 A1* | 2/2016 | Pueschner | H01L 21/302 438/114 |

OTHER PUBLICATIONS

SPTS Technologies, (Jan. 2014) "Plasma Dicing" http://www.spts.com/uploaded_files/1152/images/Dicing-A4.pdf.

* cited by examiner

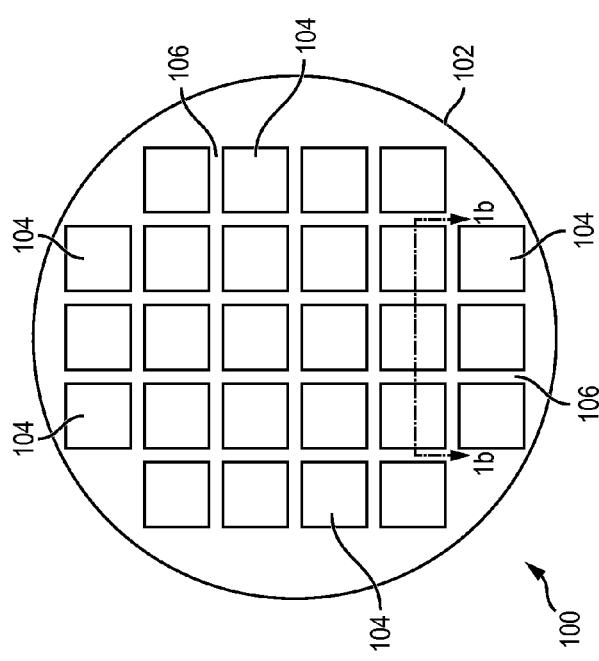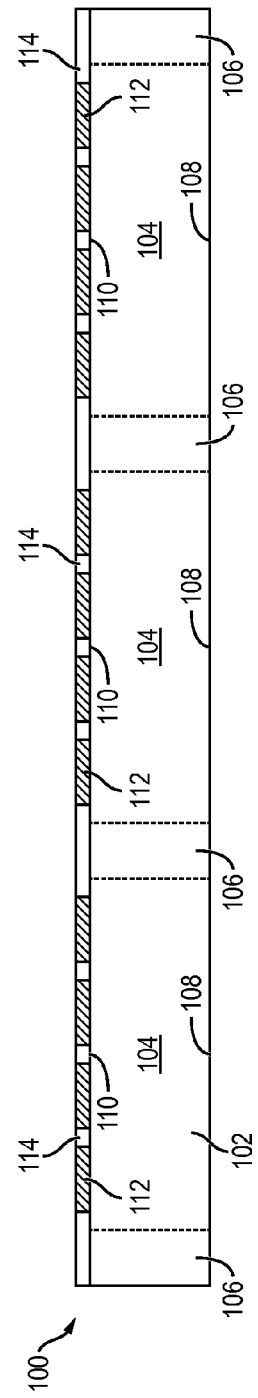

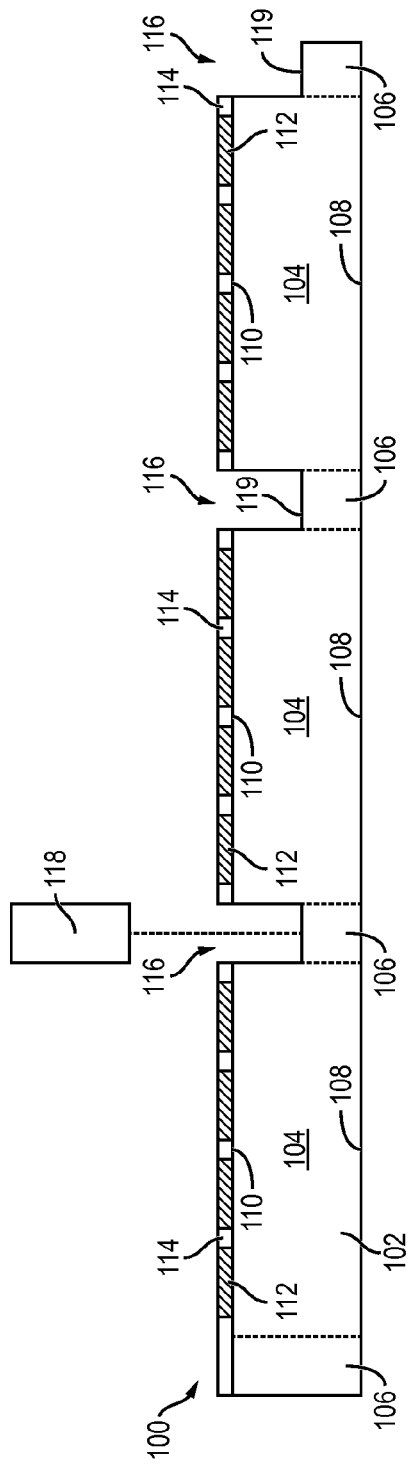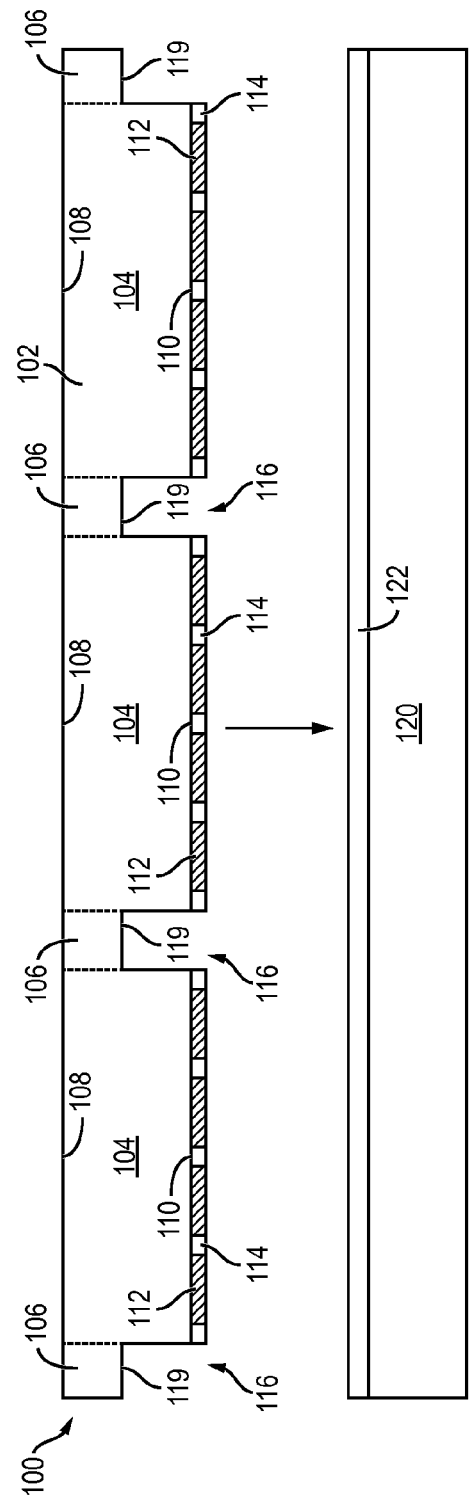
FIG. 1c
FIG. 1d

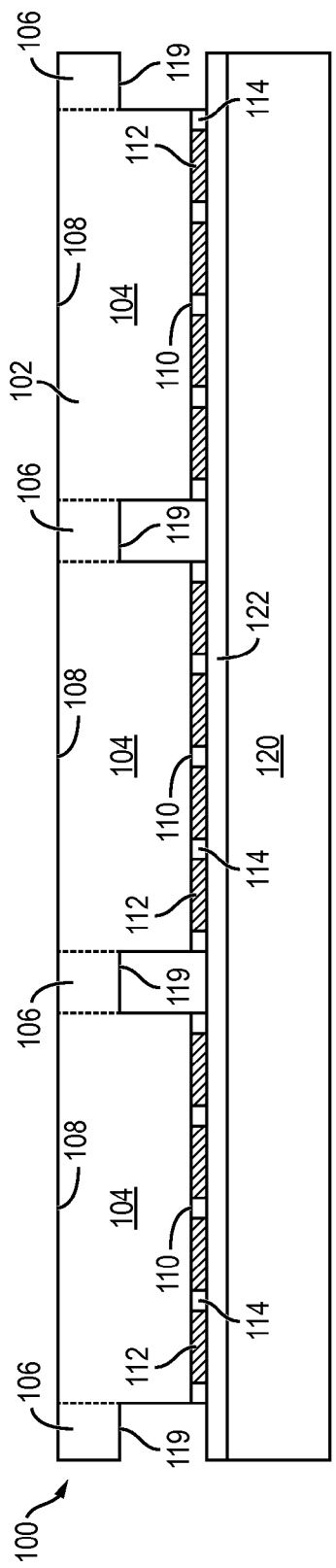
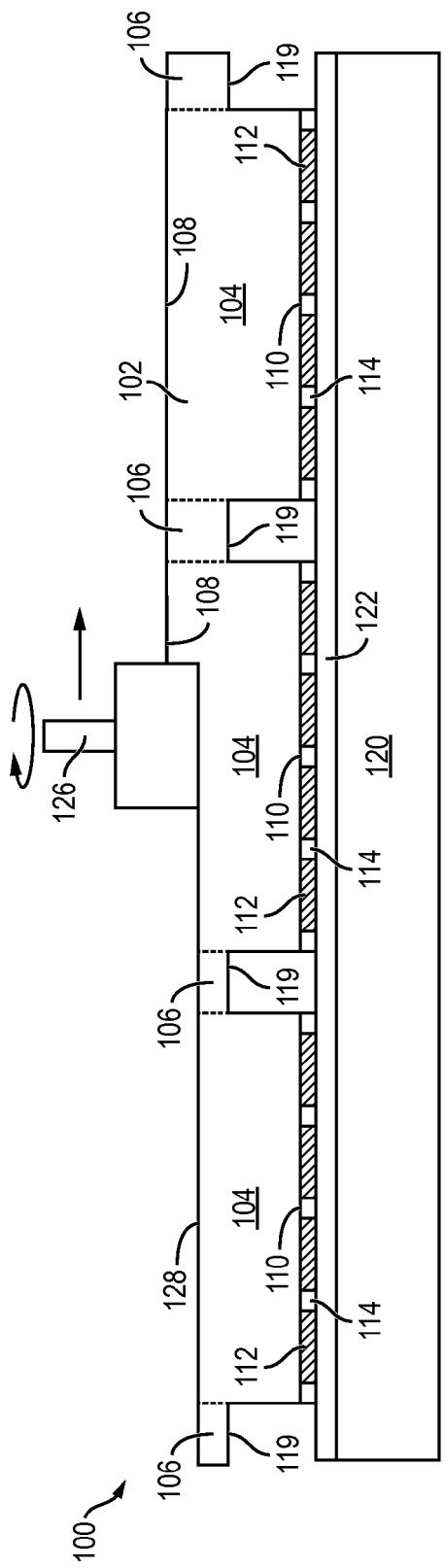

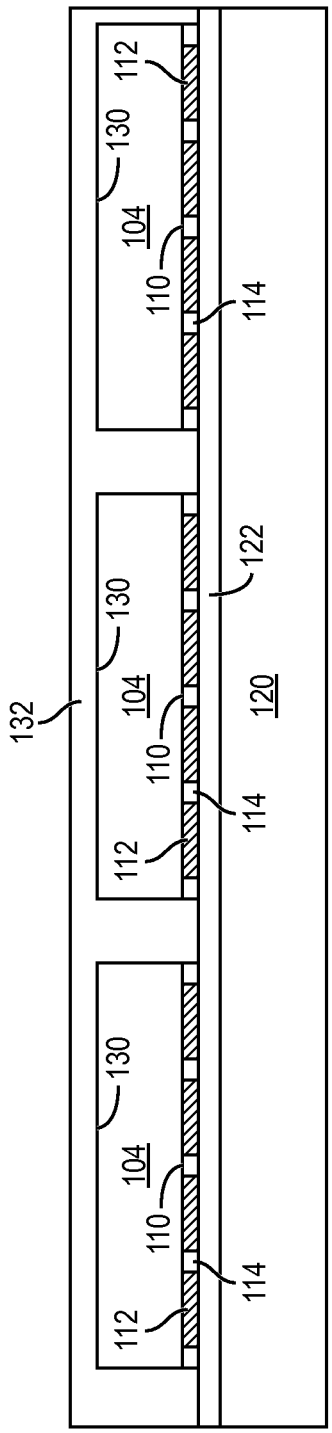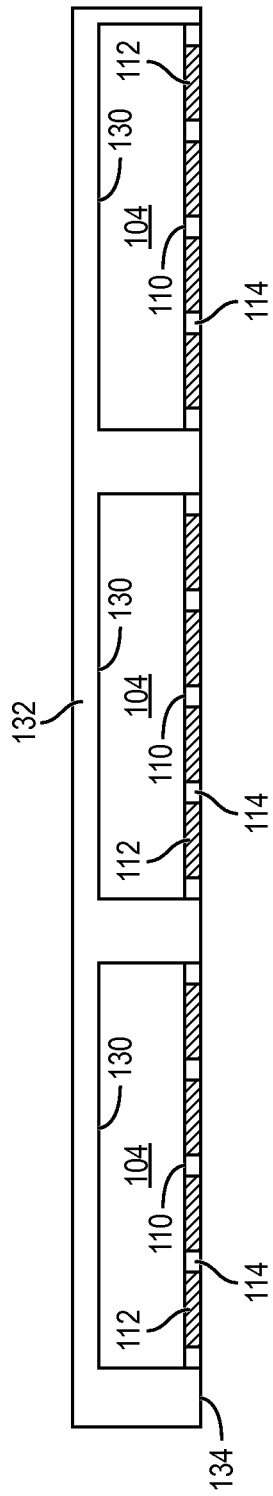

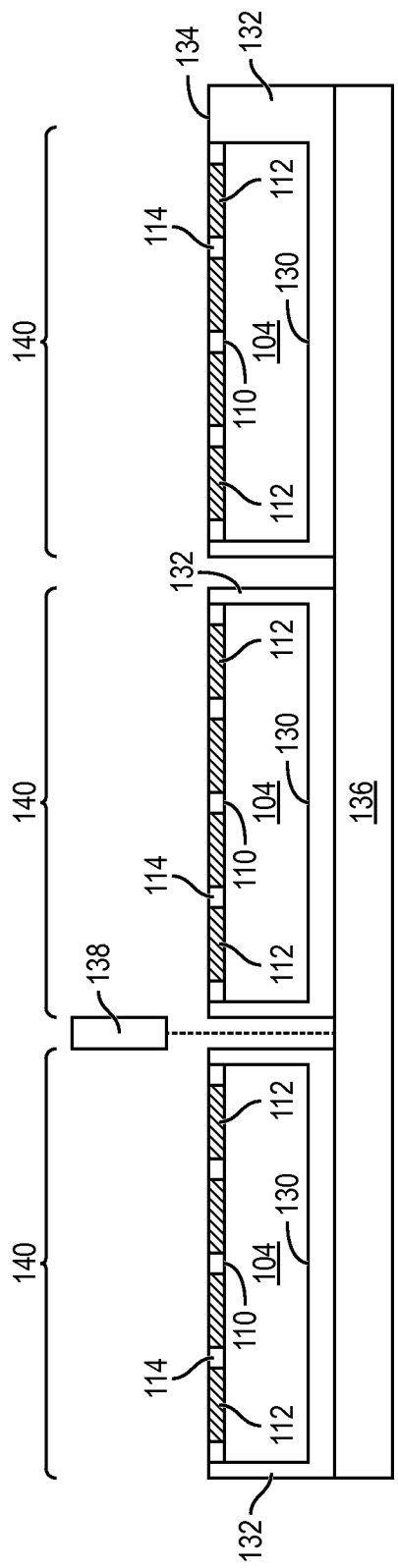
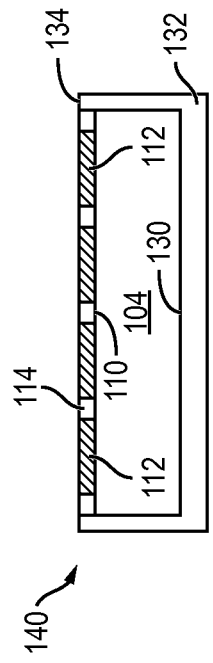
FIG. 1m
FIG. 2

SEMICONDUCTOR DEVICE AND METHOD OF ENCAPSULATING SEMICONDUCTOR DIE

FIELD OF THE INVENTION

The present invention relates in general to semiconductor devices and, more particularly, to a semiconductor device and method of encapsulating semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The semiconductor die can be subject to damage or degradation if a portion of the semiconductor die is exposed to external elements. For example, the semiconductor die can be damaged or degraded during handling or from exposure to light. Accordingly, semiconductor die are typically enclosed within an encapsulant for electrical insolation, structural support, and environmental protection of the die. Encapsulating the semiconductor die can be performed by singulating a semiconductor wafer into individual semiconductor die, mounting the semiconductor die individually to a carrier, and then depositing an encapsulant over the semiconductor. However, mounting individual semiconductor die increases manufacturing time, which decreases throughput. Individual, i.e., singulated, semiconductor die are also fragile and can be damaged during attachment to the carrier. Further, mounting individual semiconductor die to a carrier can increase a distance between the semiconductor die and an amount of encapsulant around the semiconductor die, which leads to an increase in final package size.

SUMMARY OF THE INVENTION

A need exists to encapsulate semiconductor die while increasing throughput and decreasing package size. Accordingly, in one embodiment, the present invention is a method of making a semiconductor device comprising the steps of providing a semiconductor wafer including a plurality of semiconductor die, forming a trench between the semiconductor die and partially through the semiconductor wafer, disposing the semiconductor die over a carrier, removing a first portion of the semiconductor wafer, and depositing an encapsulant over the semiconductor die and into the trench.

In another embodiment, the present invention is a method of making a semiconductor device comprising the steps of providing a semiconductor wafer including a plurality of semiconductor die, forming a trench between the semiconductor die, disposing the semiconductor die over a carrier, and depositing an encapsulant into the trench.

In another embodiment, the present invention is a method of making a semiconductor device comprising the steps of providing a plurality of semiconductor die, forming a trench between the semiconductor die, and depositing an encapsulant into the trench.

In another embodiment, the present invention is a semiconductor device comprising a carrier. A semiconductor wafer is disposed over the carrier and includes a plurality of semiconductor die separated by a trench.

BRIEF DESCRIPTION OF THE DRAWINGS

FIGS. 1a-1m illustrate a method of encapsulating semiconductor die; and

FIG. 2 illustrates an encapsulated semiconductor die.

DETAILED DESCRIPTION OF THE DRAWINGS

Figure 1E:
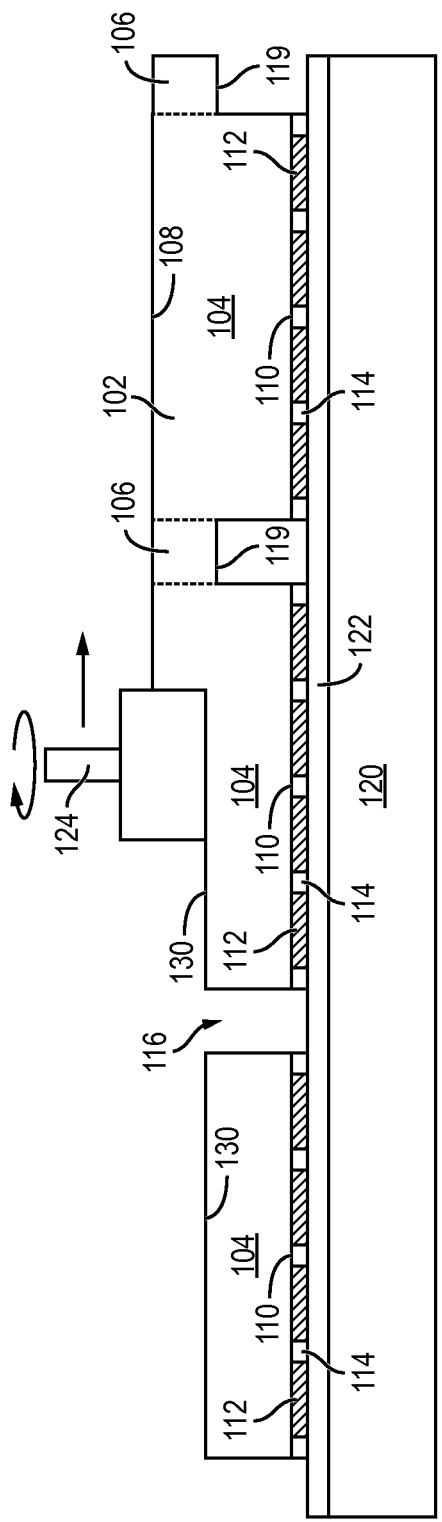

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claim equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104.

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for radio frequency (RF) signal processing.

An electrically conductive layer 112 is formed over active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), Palladium (Pd), SnAg, SnAgCu, CuNi, CuNiAu, CuNiPdAu, or other suitable electrically conductive material or combination thereof. Conductive layer 112 operates as contact pads electrically connected to the circuits on active surface 110. Contact pads 112 facilitate electrical interconnect between active circuits within semiconductor die 104 and external devices, for example, a printed circuit board (PCB).

An insulating or passivation layer 114 is formed over active surface 110 and around contact pads 112 using PVD, CVD, screen printing, spin coating, spray coating, sintering, or thermal oxidation. Insulating layer 114 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), polymer, solder resist, or other material having similar insulating and structural properties. Insulating layer 114 covers and provides protection for active surface 110. Insulating layer 114 surrounds contact pads 112 and provides electrical isolation. Portions of contact pads 112 are exposed from insulating layer 114 to allow subsequent electrical connection to semiconductor die 104.

In FIG. 1c, a plurality of trenches or openings 116 is formed in wafer 100 using cutting tool 118. In one embodiment, deep reactive ion etching (DRIE) is used to form trenches 116. Trenches 116 can also be formed using laser direct ablation (LDA), mechanical drilling, plasma etching, or other suitable process. Trenches 116 are formed between semiconductor die 104 in saw street 106. Trenches 116 are formed surrounding semiconductor die 104 in a peripheral region around semiconductor die 104. Trenches 116 are formed through insulating layer 114 and base substrate material 102. Trenches 116 extend only partially through semiconductor wafer 100 such that a portion of base substrate material 102 remains between a bottom surface 119 of trench 116 and surface 108 of semiconductor wafer 100. Semiconductor die 104 remain connected to one another by the portion of base substrate material 102 remaining in saw street 106, i.e., between surface 119 and surface 108.

FIG. 1d shows a cross-sectional view of a portion of a carrier or temporary substrate 120 containing sacrificial base substrate material such as silicon, polymer, beryllium oxide, glass, or other suitable low-cost, rigid material for structural support. An adhesive layer 122 is formed over carrier 120 as a temporary bonding film, etch-stop layer, thermal release layer, or UV release layer. In one embodiment, adhesive layer 122 is a double-sided tape attached to a surface of carrier 120. Alternatively, adhesive layer 122 can be formed on the surface of carrier 120 using spin coating, lamination, paste printing, or other suitable application process.

Semiconductor wafer 100 is disposed over adhesive layer 122 and carrier 120 with trenches 116 and active surface 110 of semiconductor die 104 oriented toward the carrier. Semiconductor die 104 are connected, or held together, by the portion of saw street 106 remaining between semiconductor die 104. The portion of saw street 106 remaining between semiconductor die 104 allows the semiconductor die 104 of wafer 100 to be mounted as a single unit. Disposing semiconductor die 104 over carrier 120 as a single unit allows semiconductor die 104 to be mounted simultaneously, in a single step.

FIG. 1e shows semiconductor die 104 disposed on adhesive layer 122 and carrier 120. After mounting semiconductor wafer 100 to carrier 120, surface 108 undergoes a backgrinding operation using grinder 124. The backgrinding operation removes a portion of base substrate material 102 from surface 108 and exposes trenches 116. The backgrinding operation removes the portion of saw street 106 that was covering trenches 116 and thins or reduces a thickness of semiconductor die 104. The removal of base substrate material 102 from back surface 108 leaves semiconductor die 104 with a new back surface 130. Alternatively, LDA, etching, polishing, chemical mechanical planarization (CMP), or other suitable removal process can be used to thin semiconductor die 104 and reveal trenches 116. The backgrinding operation singulates semiconductor die 104, i.e., after backgrinding semiconductor die 104 are no longer connected to one another by base substrate material 102. Semiconductor die 104 are held in place by adhesive layer 122 during the backgrind and after singulation, i.e., after backgrinding.

Figure 1F:
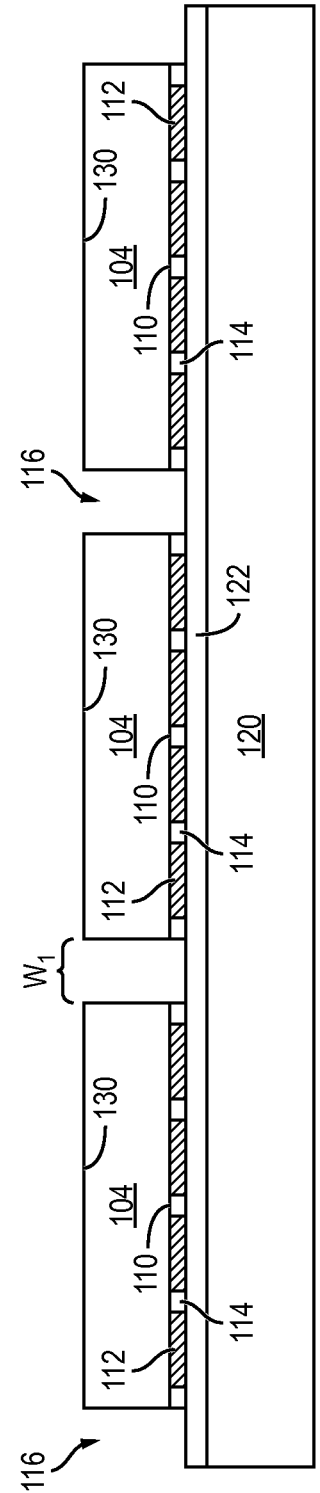

FIG. 1f shows semiconductor die 104 after the backgrinding operation. The space between the semiconductor die 104 is created by trench 116 such that a width W1 between the singulated semiconductor die 104 is equal to the width of trench 116.

FIGS. 1g-1j show an alternative method of singulating semiconductor die 104. Continuing from FIG. 1d, FIG. 1g shows wafer 100 disposed over adhesive layer 122 and carrier 120 with trenches 116 and active surface 110 of semiconductor die 104 oriented toward the carrier. Semiconductor die 104 are connected by the portion of saw street 106 remaining between surface 119 of trench 116 and surface 108 of wafer 100. The portion of saw street 106 remaining between semiconductor die 104 allows semiconductor die 104 to be mounted over carrier 120 simultaneously as a single unit.

In FIG. 1h, surface 108 of semiconductor wafer 100 undergoes a backgrinding operation to remove a portion of base substrate material 102. Grinder 126 removes base substrate material 102 from surface 108 and creates a new back surface 128. The backgrinding operation does not expose trenches 116. After the backgrinding operation, semiconductor die 104 remain connected by a portion of base substrate material 102 in saw street 106. In one embodiment, 30-40 microns of base substrate material 102 remains between surface 119 of trench 116 and new back surface 128 of wafer 100 after backgrinding.

Figure 1I:
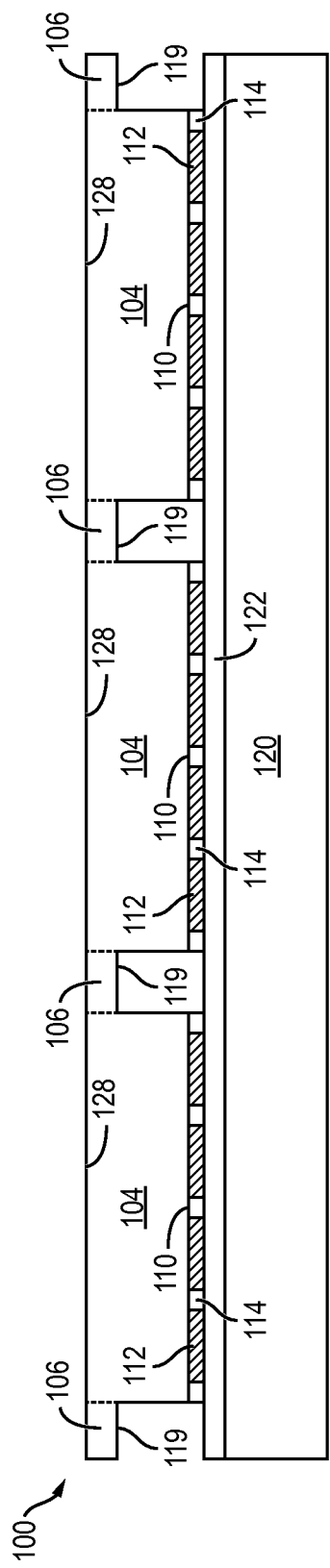

FIG. 1i shows wafer 100 after the backgrinding operation. The portion of base substrate material 102 remaining between surface 119 of trench 116 and surface 128 of wafer 100 supports and strengthens semiconductor die 104 during the backgrinding operation. The portion of base substrate material 102 connecting semiconductor die 104 lessens the grinding-stress placed on semiconductor die 104. Decreasing the grinding-stress on semiconductor die 104 reduces a likelihood of semiconductor die 104 being damaged during the backgrinding operation, which increases the reliability and throughput of functional semiconductor die 104.

The portion of saw street 106 connecting semiconductor die 104 also allows trenches 116 to remain covered during the grinding operation. Leaving trenches 116 unexposed prevents grinding debris, e.g., particles of base substrate material 102, from falling into trenches 116. Preventing grinding debris from getting into trenches 116 eliminates the need for a post-grind cleaning of trenches 116. Eliminating the post-grind cleaning process reduces manufacturing time and costs.

Figure 1J:
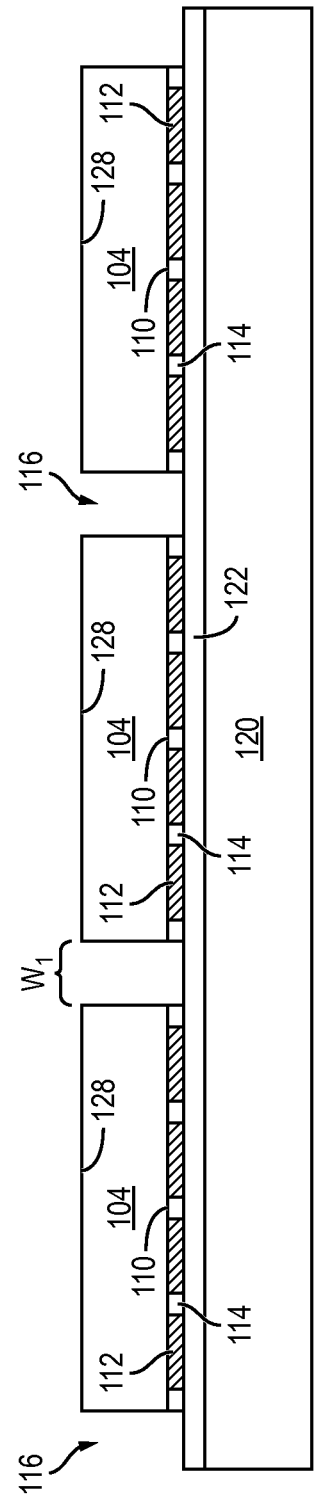

In FIG. 1j, the remaining portion of saw street 106 is removed using plasma etching, DRIE, or other suitable etching procedure. Removing the final portion of base substrate material 102 from saw streets 106 exposes trenches 116 and singulates semiconductor die 104. The etching operation used to expose trenches 116 may also remove a portion of back surface 128 to further thin semiconductor die 104. Adhesive layer 122 holds semiconductor die 104 in place both during the backgrinding and etching processes and after singulation, i.e., after etching. The space between the semiconductor die 104 is created by trench 116 such that a width W1 between the singulated semiconductor die 104 is equal to the width of trench 116.

Continuing from FIG. 1f, FIG. 1k shows an encapsulant or molding compound 132 deposited over semiconductor die 104, adhesive layer 122, and carrier 120. Encapsulant 132 is deposited over and around semiconductor die 104 using screen printing, spray coating, paste printing, compressive molding, transfer molding, liquid encapsulant molding, vacuum lamination, spin coating, or other suitable application method. Encapsulant 132 covers the four side surfaces and back surface 130 of semiconductor die 104. Encapsulant 132 includes polymer composite material, such as epoxy resin with filler, epoxy acrylate with filler, or polymer with proper filler. Encapsulant 132 is non-conductive and environmentally protects the semiconductor device from external elements and contaminants. Encapsulant 132 is deposited between semiconductor die 104 in the space created by trenches 116. Trenches 116 allow encapsulant 132 to flow over and around the side surfaces of semiconductor die 104. Encapsulant 132 can be cured immediately after deposition or later in the manufacturing process.

In FIG. 1l, carrier 120 and adhesive layer 122 are removed by chemical etching, mechanical peel-off, CMP, mechanical grinding, thermal bake, UV light, laser scanning, or wet stripping. Removing carrier 120 and adhesive layer 122 exposes insulating layer 114, contact pads 112, and a surface 134 of encapsulant 132. Surface 134 of encapsulant 132 is coplanar with the surface of insulating layer 114 and contact pads 112. Semiconductor die 104 are held together by encapsulant 132. Encapsulant 132 provides structural support and protects semiconductor die 104 during subsequent manufacturing.

After removing carrier 120 and adhesive layer 122, encapsulated semiconductor die 104 undergo a desmearing or cleaning process to remove any particles or residue from insulating layer 114, contact pads 112, and surface 134 of encapsulant 132. The cleaning process may include a spin rinse drying (SRD) process, plasma clean process, dry clean process, wet clean process, or combination of thereof.

In FIG. 1m, a dicing tape or support carrier 136 is applied over encapsulated semiconductor die 104. Encapsulated semiconductor die 104 are then singulated into individual semiconductor devices or packages 140 using a saw blade or laser cutting tool 138. Cutting tool 138 cuts through the encapsulant 132 disposed between the semiconductor die 104. Dicing tape 136 supports semiconductor die 104 during singulation. After singulation, encapsulant 132 remains over the four side surfaces of semiconductor die 104.

The active and passive components within semiconductor devices 140 undergo testing for electrical performance and circuit function. The tests may include circuit functionality, lead integrity, resistivity, continuity, reliability, junction depth, electro-static discharge (ESD), RF performance, drive current, threshold current, leakage current, and operational parameters specific to the component type. The inspection and testing enables semiconductor devices 140 that pass to be designated as known good. The known good devices are then reeled, using for example an embossed tape and reel. The reeled semiconductor devices 140 are then sent out for further processing or incorporation into other electrical devices and systems.

FIG. 2 shows semiconductor device 140 after singulation. Contacts pads 112 are electrically connected to the circuits on active surface 110 of semiconductor die 104 and facilitate subsequent connection between external devices, for example, a PCB, and semiconductor device 140. Insulating layer 114 is disposed over active surface 110 and around contact pads 112 for protection and electrical isolation. Encapsulant 132 is disposed over the back surface 130 and four side surfaces of semiconductor die 104. Encapsulant 132 provides mechanical protection, electrical isolation, and protection from degradation due to exposure to photons from light or other emissions. Encapsulant 132 environmentally protects semiconductor die 104 from external elements and contaminants.

The throughput of semiconductor device 140 is increased, as semiconductor die 104 are disposed over carrier 120 as a single wafer or unit. Disposing semiconductor die 104 over carrier 120 as a single unit simplifies manufacturing and eliminates a need to mount semiconductor die 104 individually to the carrier. Mounting semiconductor die 104 simultaneously reduces manufacturing time, which increases throughput and decreases cost. Mounting semiconductor die 104 while the semiconductor die are still in wafer form, i.e., while the semiconductor die are still connected by base substrate material 102, strengthens and increases a robustness of semiconductor die 104 during mounting. The connected semiconductor die are more supported and thus less likely to be damaged during attachment to carrier 120. Adhesive layer 122 holds semiconductor die 104 in place during the backgrinding operation. Adhesive layer 122 also maintains the alignment and spacing between semiconductor die 104 during deposition of encapsulant 132.

Mounting connected semiconductor die 104 with preformed trenches 116 increases the alignment accuracy and spacing consistency of semiconductor die 104 over carrier 120. Encapsulant 132 can be more evenly distributed over and around the semiconductor die 104 due to the consistent spacing between semiconductor die 104. Consistent spacing and even amounts of encapsulant between the semiconductor die 104 allows for increased accuracy during singulation of semiconductor devices 140. Accurate singulation creates uniform semiconductor devices 140 and decreases a likelihood of damage to semiconductor die 104 during singulation.

Encapsulated semiconductor die 104 makes a robust semiconductor device 140 with a small footprint. Semiconductor die 104 are better supported and subjected to less stress when semiconductor die 104 are mounted to carrier 120 due to the presence of base substrate material 102 between the semiconductor die 104. After singulating semiconductor die 104, encapsulant 132 is deposited over and around semiconductor die 104 to protect and support semiconductor die 104 during subsequent handling and manufacturing. Accordingly, the overall functionality and number of good semiconductor devices 140 is increased due to semiconductor die 104 being less susceptible to damage both during and after the manufacturing process.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a semiconductor wafer including a plurality of semiconductor die;
   forming a plurality of trenches including a trench in the semiconductor wafer between adjacent pairs of the plurality of semiconductor die;
   backgrinding the semiconductor wafer while a portion of the semiconductor wafer remains over the trenches between the semiconductor die;
   selectively etching the semiconductor wafer to remove the portion of the semiconductor wafer remaining over the trenches after backgrinding without etching the semiconductor die;
   depositing an encapsulant over into the plurality of trenches; and
   singulating the plurality of semiconductor die through the encapsulant.

2. The method of claim 1, further including disposing the semiconductor wafer over a carrier after forming the plurality of trenches.

3. The method of claim 2, further including disposing an adhesive layer over the carrier.

4. A method of making a semiconductor device, comprising:
   providing a semiconductor wafer including a plurality of semiconductor die, wherein each of the plurality of semiconductor die includes a contact pad formed over an active surface of the semiconductor die;
   forming an insulating layer over the semiconductor wafer, wherein a surface of the insulating layer is coplanar with a surface of the contact pads;
   forming a plurality of trenches through the insulating layer and partially through the semiconductor wafer, wherein a trench is formed between each adjacent pair of the plurality of semiconductor die;
   disposing the semiconductor wafer over a first carrier with the active surfaces of the semiconductor die oriented toward the first carrier;
   backgrinding the semiconductor wafer over the trenches, wherein a back surface of the semiconductor wafer after backgrinding extends over the trenches between the semiconductor die;

etching the back surface of the semiconductor wafer over the trenches after backgrinding the semiconductor wafer while the back surface of the semiconductor wafer remains over the semiconductor die;

depositing an encapsulant over the plurality of semiconductor die and into the plurality of trenches with the encapsulant completely filling a region between adjacent pairs of the plurality of semiconductor die, wherein a surface of the encapsulant is coplanar with the surface of the insulating layer and the surface of the contact pads;

removing the semiconductor die from the first carrier after depositing the encapsulant;

disposing the semiconductor die over a second carrier with the active surfaces of the semiconductor die oriented away from the second carrier;

cleaning the semiconductor die after removing the semiconductor die from the first carrier using a desmearing or cleaning process to remove particles or residue from the surface of the contact pads, the surface of the insulating layer, and the surface of the encapsulant; and singulating the plurality of semiconductor die through the encapsulant with the semiconductor die on the second carrier.

5. The method of claim 4, further including disposing an adhesive layer over the first carrier.

6. The method of claim 4, further including etching the back surface of the semiconductor wafer over the trenches without etching the back surface of the semiconductor wafer over the semiconductor die.

7. A method of making a semiconductor device, comprising:

providing a semiconductor wafer including a plurality of semiconductor die;

forming a plurality of trenches comprising a trench between adjacent pairs of the plurality of semiconductor die;

disposing the semiconductor wafer over a first carrier;

backgrinding the semiconductor wafer while the semiconductor die are on the first carrier to leave a back surface of the semiconductor die;

etching the semiconductor wafer after backgrinding the semiconductor wafer to physically separate the semiconductor die while the back surfaces of the semiconductor die remain over the semiconductor die;

depositing an encapsulant into the plurality of trenches after etching the semiconductor wafer with the encapsulant extending completely between side surfaces of adjacent pairs of the plurality of semiconductor die;

removing the semiconductor wafer from the first carrier after depositing the encapsulant;

disposing the semiconductor wafer on a second carrier with active surfaces of the semiconductor die oriented away from the carrier;

cleaning the active surfaces of the semiconductor die after removing the semiconductor wafer from the first carrier; and singulating the semiconductor die through the encapsulant while the semiconductor die are on the second carrier.

8. The method of claim 7, further including:

forming an adhesive layer over the first carrier; and disposing the semiconductor wafer over the adhesive layer.

9. The method of claim 7, further including forming the plurality of trenches only partially through the semiconductor wafer.

10. A method of making a semiconductor device, comprising:

providing a semiconductor wafer including a plurality of semiconductor die;

forming a plurality of trenches including a trench between adjacent pairs of the plurality of semiconductor die;

disposing the semiconductor wafer over a first carrier with the plurality of trenches oriented toward the first carrier;

depositing an encapsulant into the plurality of trenches while the semiconductor die are on the first carrier;

disposing the semiconductor die on a second carrier after depositing the encapsulant; and singulating the plurality of semiconductor die through the encapsulant while the semiconductor die are on the second carrier.

11. The method of claim 10, further including forming an adhesive layer over the first carrier.

12. The method of claim 10, further including removing a portion of the semiconductor wafer to separate the plurality of semiconductor die prior to depositing the encapsulant.

13. The method of claim 10, further including forming an insulating layer over the plurality of semiconductor die prior to depositing the encapsulant.

14. The method of claim 13, wherein a surface of the insulating layer is coplanar with a surface of the encapsulant.

15. The method of claim 13, further including forming a plurality of contact pads on the plurality of semiconductor die with surfaces of the contact pads that are coplanar with a surface of the insulating layer and a surface of the encapsulant.

* * * * *